United States Patent
Cho et al.

(10) Patent No.: US 12,534,638 B2
(45) Date of Patent: Jan. 27, 2026

(54) PROTECTIVE COATING COMPOSITION FOR CIRCUIT BOARD

(71) Applicants: Samsung Electronics Co., Ltd., Suwon-si (KR); Junghoon Lee, Ulsan (KR)

(72) Inventors: Raehong Cho, Suwon-si (KR); Jaesung Lee, Suwon-si (KR); Junghoon Lee, Ulsan (KR); Geunwoo Park, Suwon-si (KR); Jeongmin Park, Suwon-si (KR)

(73) Assignees: Samsung Electronics Co., Ltd., Suwon-si (KR); Junghoon Lee, Ulsan (KR)

( * ) Notice: Subject to any disclaimer, the term of this patent is extended or adjusted under 35 U.S.C. 154(b) by 852 days.

(21) Appl. No.: 17/768,063

(22) PCT Filed: Jun. 25, 2020

(86) PCT No.: PCT/KR2020/008281
§ 371 (c)(1),
(2) Date: Apr. 11, 2022

(87) PCT Pub. No.: WO2021/075664
PCT Pub. Date: Apr. 22, 2021

(65) Prior Publication Data
US 2023/0117510 A1     Apr. 20, 2023

(30) Foreign Application Priority Data
Oct. 16, 2019   (KR) .................... 10-2019-0128718

(51) Int. Cl.
| C09D 161/02 | (2006.01) |
| C09D 7/20 | (2018.01) |
| C09D 123/08 | (2006.01) |
| H05K 3/28 | (2006.01) |

(52) U.S. Cl.
CPC .......... C09D 161/02 (2013.01); C09D 7/20 (2018.01); C09D 123/0846 (2013.01); H05K 3/282 (2013.01)

(58) Field of Classification Search
None
See application file for complete search history.

(56) References Cited

U.S. PATENT DOCUMENTS

| 2,495,285 | A | * | 1/1950 | Hoehn | D21H 19/22 |
| | | | | | 524/914 |
| 4,866,122 | A | * | 9/1989 | Gerlowski | C08L 73/00 |
| | | | | | 528/392 |
| 4,895,689 | A | * | 1/1990 | Gerlowski | C08J 5/18 |
| | | | | | 264/237 |
| 2013/0032853 | A1 | | 2/2013 | Kawata et al. | |
| 2019/0338088 | A1 | * | 11/2019 | Kress | C08F 216/36 |
| 2020/0247948 | A1 | * | 8/2020 | Matsutani | H05B 33/02 |
| 2022/0002559 | A1 | * | 1/2022 | Zimmerman | H05K 3/284 |

FOREIGN PATENT DOCUMENTS

| CN | 110041747 A | * | 7/2019 |
| KR | 10-0321205 B1 | | 7/2002 |
| KR | 10-0505389 B1 | | 7/2005 |
| KR | 10-1194541 B1 | | 10/2012 |
| KR | 10-2013-0007710 A | | 1/2013 |
| KR | 10-2014-0061556 A | | 5/2014 |
| KR | 10-1452173 B1 | | 10/2014 |
| KR | 10-1778820 B1 | | 9/2017 |
| KR | 10-2019-0109433 A | | 9/2019 |

OTHER PUBLICATIONS

Machine Translation of CN-110041747 (Year: 2019).*
SIMAN; Polyketone: Properties and Limitations; www.plasticstoday.com/content/polyketone-makes-comeback/18994310621346.
Cole et al.; Harsh Environment Impact on Resistor Reliability; SMTA International 2010 Conference Proceedings; Jan. 2010.
Grissom et al.; Evaluation of Coating Performance on Silver Exposed To Hydrogen Sulfide; American Institute for Conservation o Historic and Artistic Works 2013; Journal of the American Institute for Conservation 2013, vol. 52 No. 2, 82-96; Jul. 2013.
3M; Corrosion Protection of Metal Surfaces from Sulfur by Using 3M™ Novec™ Electronic Grade Coatings; Technical Paper; Apr. 14, 2014; St. Paul, MN.
Wikipedia: Polyketone; May 20, 2022.
Wikipedia: Ethylene vinyl alcohol; Sep. 17, 2021.
(Continued)

*Primary Examiner* — Michael Forrest
(74) *Attorney, Agent, or Firm* — Jefferson IP Law, LLP

(57) ABSTRACT

The present disclosure provides a protective coating composition for circuit boards, the composition capable of i) forming a protective coating for effectively protecting a circuit board and an electrical/electronic component mounted thereon, from moisture, foreign materials, and corrosive gas, ii) reducing the formation time of a protective coating, iii) forming a protective coating capable of achieving optimal protective performance with a smaller thickness, and iv) forming a protective coating that is easier to remove. According to one aspect of the present disclosure, an embodiment of the protective coating composition for circuit boards includes a polyketone, and a solvent.

9 Claims, No Drawings

(56) References Cited

OTHER PUBLICATIONS

International Search Report with Written Opinion and English translation dated Mar. 26, 2021; International Appln. No. PCT/KR2020/008281.
Korean Office Action with English translation dated Mar. 3, 2021; Korean Appln. No. 10-2019-0128718.
Korean Notice of Allowance with English translation dated Dec. 20, 2021; Korean Appln. No. 10-2019-0128718.
Korean Office Action with English translation dated Sep. 17, 2021; Korean Appln. No. 10-2019-0128718.
Korean Office Action with English translation dated Mar. 8, 2022; Korean Appln. No. 10-2022-0014867.
Indian Office Action dated Feb. 15, 2025, issued in an Indian Patent Application No. 202217026398.
Indian Office Action dated Aug. 21, 2025, issued in an Indian Patent Application No. 202217026398.
Indian Office Action dated Oct. 17, 2025, issued in an Indian Patent Application No. 202217026398.
Indian Hearing Notice dated Dec. 17, 2025, issued in an Indian Patent Application No. 202217026398.

* cited by examiner

PROTECTIVE COATING COMPOSITION FOR CIRCUIT BOARD

TECHNICAL FIELD

The present disclosure relates to a protective coating composition for circuit boards, and more specifically, to a protective coating composition for forming a protective coating for protecting metal materials in electrical/electronic components mounted on a circuit board from corrosion and contamination.

BACKGROUND ART

Various electrical/electronic components mounted on a circuit board (for example, a printed circuit board) contain metal materials such as copper, silver, gold, lead, tin, or brass. Such metal materials may be corroded by moisture or corrosive gas. Also, such metal materials may be contaminated (or contacted) by foreign materials. Such corrosion and/or contamination of the metal materials in the electrical/electronic components mounted on a circuit board shorten the lifetime of the product containing the circuit board, and/or cause malfunctions thereof. To prevent such issues from arising, a protective coating (for example, a conformal coating) is applied onto a circuit board on which electrical/electronic components are mounted. Accordingly, the protective coating functions as a barrier layer that covers at least part or the entirety of the outer surfaces of the circuit board and the electrical/electronic components.

Conventional conformal coatings are formed of a coating composition containing, for example, an acrylic resin, an epoxy resin, a silicone resin, a urethane resin, or a fluorinated polymer. Thus, conventional conformal coatings effectively prevent the infiltration of moisture and contact with foreign materials. However, conventional conformal coatings cannot effectively prevent infiltration of corrosive gases (hydrogen sulfide in particular).

Corrosive gas, which can cause corrosion of metals, react with metal materials in the electrical/electronic components to diminish electrical conductivity of the metal materials, and deform the shape of the metal materials, thus causing the metal materials to lose their inherent characteristics. Examples of such corrosive gas include hydrogen sulfide ($H_2S$), sulfur dioxide ($SO_2$), chlorine ($Cl_2$), or nitrogen dioxide ($NO_2$). In particular, hydrogen sulfide is often detected in comparatively high concentrations in areas with a high level of air pollution, and corrodes metals (silver, copper, or tin in particular) at an extremely fast rate.

In addition, most conformal coatings are formed from curable coating compositions, and such curable coating compositions require a long curing time for the formation of a conformal coating. Commonly, thermal curing for a conformal coating is conducted at about 60° C. to about 80° C. for at least about 3 hours. As such, curable coating compositions for conventional conformal coating are inefficient in terms of reduction of protective coating formation time. Further, it is extremely difficult to remove cured conformal coatings. In the event of a defect occurring in an electrical/electronic component mounted on a circuit board, cured conformal coatings covering the defective electrical/electronic component make the replacement of the defective electrical/electronic component far more difficult. Furthermore, heating a cured conformal coating with a heating means (for example, an iron or a heat gun) to remove the cured conformal coating generates harmful gases due to combustion and thermal decomposition of the cured conformal coating.

The document ⌈CAROL A. GRISSOM et al., "EVALUATION OF COATING PERFORMANCE ON SILVER EXPOSED TO HYDROGEN SULFIDE", Journal of the American Institute for Conservation, 2013, Vol. 52, No. 2, 82-96⌋ discloses that 12 coatings applied on sterling silver coupons were exposed to hydrogen sulfide of a high concentration to thereby test the effect thereof on preventing tarnish in an indoor environment. According to this document, the coatings formed from acrylic dispersion, cellulose nitrate, and polyvinyl acetate exhibited high performance, and the coatings formed from acrylic resins and polyvinyl butyral exhibited moderate performance. According to FIG. 9 of this document, these coatings exhibited optimal performance at a relatively large thickness (15 μm to 71 μm). Thicker coatings are less efficient in terms of coating formation speed and coating removal ease. In particular, the thicker the protective coating, the greater the amount of harmful gases and odors that may be generated from the protective coating by the heat generated from high-temperature soldering associated with the process of replacing a defective electrical/electronic component on a circuit board. The thicker the protective coating, the higher the chance of uncured/undried coating compositions remaining inside the protective coating. Such uncured/undried coating compositions inside the protective coating may cause soldering defects. Further, this document did not demonstrate whether the coatings disclosed therein could protect electrical/electronic components mounted on a circuit board from hydrogen sulfide.

Technical Problem

The present disclosure provides a protective coating composition for circuit boards, the composition capable of i) forming a protective coating for effectively protecting a circuit board and an electrical/electronic component mounted thereon, from moisture, foreign materials, and corrosive gas, ii) reducing the formation time of a protective coating, iii) forming a protective coating capable of achieving optimal protective performance with a smaller thickness, and iv) forming a protective coating easier to remove.

Solution to Problem

According to one aspect of the present disclosure, an embodiment of the protective coating composition for circuit boards includes a polyketone, and a solvent.

In another embodiment of the protective coating composition for circuit boards of the present disclosure, the amount of the polyketone in the protective coating composition may be about 0.1 wt % to about 90 wt % with respect to the total weight of the protective coating composition.

In another embodiment of the protective coating composition for circuit boards of the present disclosure, the solvent may include ethyl alcohol, isopropyl alcohol, methyl isobutyl ketone, normal butyl alcohol, propylene glycol monomethyl ether, xylene, toluene, methyl ethyl ketone, acetone, hexanone, or a combination thereof.

In another embodiment of the protective coating composition for circuit boards of the present disclosure, the solvent may include ethyl alcohol, isopropyl alcohol, methyl isobutyl ketone, normal butyl alcohol, propylene glycol monomethyl ether, or a combination thereof.

In another embodiment of the protective coating composition for circuit boards of the present disclosure, the solvent may include a mixture of ethyl alcohol and normal butyl alcohol, or a mixture of ethyl alcohol and propylene glycol monomethyl ether.

A method of forming a protective coating for circuit boards according to another aspect of the present disclosure includes performing, at least once, a process of applying a protective coating composition of the present disclosure on at least a portion of a surface of a circuit board on which an electrical/electronic component is mounted and then drying the protective coating composition.

In another embodiment of the method of forming a protective coating for circuit boards of the present disclosure, a thickness of the finally formed protective coating may be about 2 μm to about 5 μm.

A laminate according to another aspect of the present disclosure includes a circuit board on which an electrical/electronic component is mounted, and a protective coating formed on at least a portion of a surface of the circuit board, wherein the protective coating includes a polyketone.

In another embodiment of the laminate of the present disclosure, a thickness of the protective coating may be about 2 μm to about 5 μm.

BEST MODE

Polyketones

In the present disclosure, the term 'polyketone' refers to any polymer and copolymer including a repeat unit containing a carbonyl group (—C(=O)—). The polyketone includes a ketone resin and a ketone/aldehyde resin. The ketone/aldehyde resin refers to a resin formed by condensation of a ketone and an aldehyde. The polyketone may include, for example, at least one of repeat units represented by Equation 1 below.

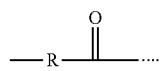

Equation 1

Here, R may be a linear or branched alkylene group having 2 to 12 carbon atoms, an arylene group having 6 to 30 carbon atoms, a linear or branched alkyl ether group having 2 to 12 carbon atoms, an aryl ether group having 6 to 30 carbon atoms, a linear or branched alkyl ester group having 2 to 12 carbon atoms, or an aryl ester group having 6 to 30 carbon atoms.

The polyketone may be prepared, for example, by condensing ketones (for example, alicyclic ketones, such as, cyclohexanone or a derivative thereof), in combination with an aldehyde (for example, formaldehyde) where appropriate, in the presence of an alkaline catalyst. Alternatively, the polyketone may be prepared, for example, by a reaction between a compound containing an unsaturated double bond and carbon monoxide. Alternatively, the polyketone may be, for example, an alternating copolymer prepared by a reaction between at least one ethylene-based unsaturated hydrocarbons and carbon monoxide. Alternatively, the polyketone may be prepared, for example, by a gas-phase reaction of ethylene and/or propylene with carbon monoxide in the presence of a palladium (II) catalyst.

A number average molecular weight of a polyketone, when measured by gel permeation chromatography, may be, for example, from about 1,000 g/mol to about 200,000 g/mol, or from about 20,000 g/mol to about 90,000 g/mol, but may be outside these ranges.

In carbonyl groups positioned on the main chain of the polyketone, as oxygen atoms strongly attract electrons in carbon atoms, the carbonyl groups show polarity. Due to such polarity of carbonyl groups, an electric attraction occurs between polyketone chains. Due to such electric attraction, distances between the polyketone chains decrease. Such a densely arranged structure of the polyketone chains makes it extremely difficult for corrosive gas to penetrate a polyketone layer. Accordingly, the protective coating composition for circuit boards of the present disclosure, containing a polyketone, may form a protective coating that effectively prevents the infiltration of corrosive gas.

In another embodiment, the polyketone may include a repeat unit represented by Equation 2 below.

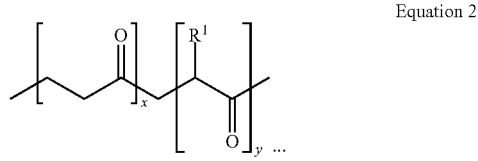

Equation 2

Here, R1 may be hydrogen, a linear or branched alkyl group having 1 to 12 carbon atoms, an aryl group having 6 to 30 carbon atoms, a linear or branched alkyl ether group having 1 to 12 carbon atoms, an aryl ether group having 6 to 30 carbon atoms, a linear or branched alkyl ester group having 1 to 12 carbon atoms, or an aryl ester group having 6 to 30 carbon atoms, wherein x:y may be about 1:999 to about 999:1.

The bigger the size of R1 group, the more it is hindered for polyketone chains to form a dense arrangement. Conversely, the smaller the size of R1 group, the less it is hindered for polyketone chains to form a dense arrangement. Accordingly, the smaller the size of R1 group, the more effective the blocking of corrosive gas by a polyketone layer. In this respect, R1 may be preferably hydrogen or a linear or branched alkyl group having 1 to 5 carbon atoms, may be more preferably hydrogen or a methyl group, and may be most preferably, hydrogen.

As described above, the smaller the size of R1 group, the more densely the polyketone chains are arranged, and as a result, the crystallinity of the polyketone layer increases. The polyketone layer with a greater crystallinity may have a greater brittleness. Conversely, as the size of R1 group increases, the polyketone layer may have a reduced crystallinity and consequently, a reduced brittleness (that is, increased flexibility). Therefore, to provide a polyketone layer having both excellent corrosive gas protection characteristics and flexibility, R1 may be more preferably a linear or branched alkyl group having 1 to 5 carbon atoms, and may be most preferably, a methyl group.

The amount of polyketones in the protective coating composition may be about 0.1 wt % to about 90 wt % with respect to the total weight of the protective coating composition. The smaller the amount of the polyketones in the protective coating composition, the lower the viscosity of the protective coating composition. Such a protective coating composition with a low viscosity may be suitable for a spray method. The greater the amount of the polyketones in the protective coating composition, the greater the viscosity of the protective coating composition. Such a protective coating composition with a high viscosity may be suitable for a painting method.

Ethylene Vinyl Alcohol Resin

In another embodiment of the present disclosure, the protective coating composition may further include an ethylene vinyl alcohol resin. As commonly known, ethylene vinyl alcohol resins can block gases, such as oxygen and hydrogen, extremely effectively. However, ethylene vinyl alcohol resins are extremely costly. Furthermore, such ethylene vinyl alcohol resins are hydrophilic due to the presence of —OH groups, and as a result, exhibit inferior moisture protection characteristics. Therefore, ethylene vinyl alcohol resins alone cannot be used in a protective coating composition.

However, when an ethylene vinyl alcohol resin is used in combination with polyketones, due to excellent moisture protection characteristics of polyketones, inferior moisture protection characteristics of the ethylene vinyl alcohol resin may be compensated. In addition, due to excellent gas protection characteristics of the ethylene vinyl alcohol resin, corrosive gas protection characteristics of polyketones may be enhanced. When a combination of polyketones and an ethylene vinyl alcohol resin is used, the weight ratio of the ethylene vinyl alcohol resin to the polyketones may be, for example, about 1:999 to about 999:1. In the protective coating composition, the amount of a combination of a polyketone and an ethylene vinyl alcohol resin may be, for example, about 0.1 wt % to about 90 wt % with respect to the total weight of the protective coating composition.

The ethylene vinyl alcohol resin may be prepared as follows, for example: first, forming an ethylene vinyl acetate copolymer by copolymerizing an ethylene and a vinyl acetate, and hydrolyzing the ethylene vinyl acetate copolymer to thereby produce the ethylene vinyl alcohol resin. Alternatively, the ethylene vinyl alcohol resin may be commercially available.

Solvent

The solvent of the protective coating composition of the present disclosure may be any solvent capable of dissolving polyketones (or, a combination of polyketones and ethylene vinyl alcohol resin). Examples of the solvent may include ethyl alcohol, isopropyl alcohol, methyl isobutyl ketone, normal butyl alcohol, propylene glycol monomethyl ether, xylene, toluene, methyl ethyl ketone, acetone, hexanone, or a combination thereof. Preferably, the solvent may include ethyl alcohol, isopropyl alcohol, methyl isobutyl ketone, normal butyl alcohol, propylene glycol monomethyl ether, or a combination thereof, and these solvents are highly effective at dissolving polyketones and can be dried at a fast rate due to a low boiling point. Most preferably, the solvent may include a mixture of ethyl alcohol and normal butyl alcohol, or a mixture of ethyl alcohol and propylene glycol monomethyl ether. The inventors have discovered that such a mixture of ethyl alcohol and normal butyl alcohol, or a mixture of ethyl alcohol and propylene glycol monomethyl ether, has a fast drying rate, and also, prevents blushing from occurring in the formed protective coating. In the mixture of ethyl alcohol and normal butyl alcohol, the weight ratio of normal butyl alcohol to ethyl alcohol may be, for example, about 1:99 to about 99:1. In the mixture of ethyl alcohol and propylene glycol monomethyl ether, the weight ratio of propylene glycol monomethyl ether to ethyl alcohol may be, for example, about 1:99 to about 99:1. The amount of solvent in the protective coating composition is a remainder amount in the protective coating composition, except for polyketones (or, combination of a polyketone and an ethylene vinyl alcohol resin) and additives.

Additives

Another embodiment of the protective coating composition of the present disclosure may further include an additive. Examples of the additive may include a low-molecular weight acrylic levelling agent, a fluorescent bleaching agent, or a combination thereof. The low-molecular acrylic levelling agent can lower the surface tension of the protective coating composition, thereby increasing smoothness of the protective coating. The amount of additives in the protective coating composition may be about 0.01 wt % to about 20 wt % with respect to the total weight of the protective coating composition.

Preparation of Protective Coating Composition

The protective coating composition of the present disclosure may be prepared by dissolving, in a solvent, polyketones (or a combination of polyketones and ethylene vinyl alcohol resin) and optionally, an additive.

Formation of Protective Coating

A method of forming a protective coating according to another aspect of the present disclosure includes performing, at least once, a process of applying a protective coating composition according to one aspect of the present disclosure on at least a portion of a surface of a circuit board on which an electrical/electronic component is mounted, and then drying the applied protective coating composition. The application of the protective coating composition may be performed by, for example, a spray method, a painting method, or a combination thereof. The drying of the applied protective coating composition refers to removal of a solvent from the applied protective coating composition. The time and temperature for the drying of the applied protective coating composition may vary depending on the solvent used. For example, the drying time may be about 1 second to about 1 hour, or about 10 seconds to about 10 minutes, or about 30 seconds to about 3 minutes, or about 1 minute to about 2 minutes. For example, the drying temperature may be about 0° C. to about 60° C., about 5° C. to about 50° C., or about 10° C. to about 40° C., or about 20° C. to about 30° C.

The thickness of the finally formed protective coating increases as the number of the above processes performed. The thickness of the finally formed protective coating may be, for example, about 1 μm or more, or about 2 μm or more, or about 3 μm or more, or about 5 μm or more, or about 12 μm or more, or about 16 μm or more. The thickness of the finally formed protective coating may be, for example, about 20 μm or less, or about 16 μm or less, or about 12 μm or less, or about 5 μm or less, or about 3 μm or less. It was found that when the finally formed protective coating has a thickness of about 2 μm or more, the infiltration of corrosive gas (hydrogen sulfide in particular) is extremely effectively prevented. Therefore, preferably, the thickness of the finally formed protective coating may be, for example, about 2 μm to about 5 μm. Most preferably, the thickness of the finally formed protective coating may be, for example, about 2 μm to about 3 μm.

Laminate Including Circuit Board and Protective Coating

By the above-described method of forming a protective coating of the present disclosure, a protective coating including a polyketone may be laminated on at least a portion of a surface of a circuit board on which an electrical/electronic component is mounted. Accordingly, provided according to another aspect of the present disclosure is a laminate including: a circuit board on which an electrical/electronic component is mounted; and a protective coating formed on at least a portion of a surface of the circuit board, the protective coating including a polyketone.

Removal of Protective Coating

In the present disclosure, removal of at least a portion of the protective coating from a laminate including "a circuit board on which an electrical/electronic component is mounted" and "a protective coating including a polyketone" in order to replace a defective electrical/electronic component may be performed in an extremely convenient manner. That is, by contacting an area of the protective coating sought to be removed, with a solvent capable of dissolving a polyketone, the protective coating may be removed in an extremely simple manner. The solvent may be brought in contact with the protective coating by, for example, a spray method, a painting method, or a combination thereof. Examples of the solvent capable of dissolving a polyketone may include ethyl alcohol, isopropyl alcohol, methyl isobutyl ketone, normal butyl alcohol, propylene glycol monomethyl ether, xylene, toluene, methyl ethyl ketone, acetone, hexanone, or a combination thereof. The solvent used for removal of the protective coating may be the same solvent used in the preparation of the protective coating composition, or may be different therefrom.

MODE OF DISCLOSURE

Examples

Preparation of Protective Coating Composition

According to compositions shown in Table 1, the protective coating composition of Examples 1 to 4 and Comparative Examples 1 to 4 were prepared at room temperature.

Sulfur was introduced under a desiccator. Then, a tray was installed in the middle of the desiccator. Next, on the tray inside the desiccator, the copper samples having a protective coating were arranged. Next, the lid of the desiccator was closed. Next, the desiccator was placed in an oven at 105° C.

Next, over 30 days, the presence or absence of discoloration in the respective copper samples inside the desiccator was observed with naked eyes. Since, for all of the copper samples with a discoloration, the discoloration occurred over the entire surface of the corresponding copper sample, observing for discoloration of the copper samples with naked eyes was extremely apparent and easy. The time points at which such discolorations occurred were summarized in Table 2.

TABLE 2

| Example No. | Number of days until discoloration |
| --- | --- |
| Example 1 | No discoloration even after 30 days |
| Example 2 | No discoloration even after 30 days |
| Example 3 | No discoloration even after 30 days |
| Example 4 | No discoloration even after 30 days |
| Comparative Example 1 | Discoloration after 1 day |
| Comparative Example 2 | Discoloration after 1 day |
| Comparative Example 3 | Discoloration after 1 day |
| Comparative Example 4 | Discoloration after 1 day |

Ag Corrosion Protection Performance Test

Resistor, which is a representative example of electrical/electronic components, contains silver (Ag). When a resistor

TABLE 1

| | Composition (wt %) | | | | | | | |
| --- | --- | --- | --- | --- | --- | --- | --- | --- |
| Material name | Example 1 | Example 2 | Example 3 | Example 4 | Comparative Example 1 | Comparative Example 2 | Comparative Example 3 | Comparative Example 4 |
| Polyketone (Germany, TEGO, Product name: VariPlus CA) | | | 5 | 5 | | | | |
| Polyurethane (Germany, TEGO, Product name: VariPlus SK) | | | | | | | | 5 |
| Polyketone (Korea, Hyundai Chemical, SN-206) | 5 | 5 | | | | | 2.5 | |
| Acrylic lacquer resin (Korea, Aekyung Chemical Co., Ltd., 52-204) | | | | | 5 | | | |
| Polyvinyl butyral (Japan, Kuraray Korea Co., Ltd., PVB) | | | | | | 5 | 2.5 | |
| Acrylic leveling agent (Korea, FTC Korea, LA-45) | | 0.5 | 0.5 | | | | | 0.5 |
| Fluorine wax (USA, SHAMROCK, SST-3) | | 0.5 | | | | | | |
| Ethanol (Korea, SYT ETHANOL Co. Ltd., ETOH99) | 95 | 94 | 94.5 | 55 | 39 | 39 | 39 | 94.5 |
| Propylene Glycol Monomethyl Ether (Korea, SAMYUNG TRADING Co. Ltd., PM) | | | | 40 | | | | |
| Isopropyl Alcohol (Korea, SAMYUNG TRADING Co. Ltd., IPA) | | | | | 23 | 23 | 23 | |
| Methyl Isobutyl Ketone (Korea, SAMYUNG TRADING Co. Ltd., MIBK) | | | | | 33 | 33 | 33 | |
| Total | 100 | 100 | 100 | 100 | 100 | 100 | 100 | 100 |

Corrosion Protection Performance Test

Each of the protective coating compositions of Examples 1 to 4 and Comparative Examples 1 to 4 was applied onto the entire surface of a copper sample by a spray method, and dried at room temperature for 1 minute. Such application and drying processes were repeated until the thickness of the formed protective coating reached 2 μm.

is exposed to hydrogen sulfide, silver inside the resistor reacts with hydrogen sulfide and forms silver sulfide. Since silver sulfide is a nonconductor, a resistor exposed to hydrogen sulfide comes to have an increased resistance value. Therefore, through changes in resistance value of the resistor covered with a protective coating, hydrogen sulfide protection performance of the protective coating can be evaluated.

First, a test circuit board was prepared by mounting 40 resistors (Samsung Electro-Mechanics, 5 kΩ) on a test PCB. 10 of such test circuit boards were prepared. Each of the protective coating compositions of Examples 1 to 4, Comparative Examples 1 to 4, and Comparative Example 5 (Novec 2704, 3M) was applied on the entire surface of the test circuit board by a spraying method, and dried at room temperature for 1 minute. Such application and drying processes were repeated until the thickness of the formed protective coating reached 2 μm.

Sulfur was introduced under a desiccator. Then, a tray was installed in the middle of the desiccator. Next, on the tray inside the desiccator, the test circuit boards having a protective coating were arranged. Next, the lid of the desiccator was placed. Next, the desiccator was placed in an oven at 105° C.

Next, for 30 days, resistance values of 40 resistors on each of the test circuit boards in the desiccator were measured daily. If a resistor has a resistance value that is increased by 10% or more of the original resistance value, said resistor was determined as defective. However, in practice, all of defective resistors had infinitely increased resistance values, and thereby, it was extremely clear and easy to determine whether a resistor was defective. Defective rate was calculated by determining how many of the 40 resistors mounted on each of the test circuit boards were defective. The results are summarized in Table 3.

TABLE 3

| Example No. | Defective rate after 10 days | Defective rate after 20 days | Defective rate after 30 days |
|---|---|---|---|
| Example 1 | 0% | 0% | 3% |
| Example 2 | 0% | 0% | 3% |
| Example 3 | 0% | 0% | 3% |
| Example 4 | 0% | 0% | 3% |
| Comparative Example 1 | 8% | 40% | 58% |
| Comparative Example 2 | 60% | 80% | 100% |
| Comparative Example 3 | 3% | 3% | 8% |
| Comparative Example 4 | 0% | 15% | — |
| Comparative Example 5 (Novec 2704, 3M) | 24% | 80% | 91% |
| Comparative Example 6 (Uncoated circuit board) | 96% | (100% after 15 days) | — |

Ag Corrosion Protection Performance Test According to Coating Thickness 6 of the test circuit boards described above were prepared. The respective protective coating compositions of Example 1 and Comparative Example 5 (Novec 2704, 3M) were applied onto the entire surface of the respective test circuit boards by a spraying method, and dried at room temperature for 1 minute. The above application and drying processes were repeated until the thickness of the formed protective coating reached thicknesses shown in Table 4. The Ag corrosion protection performance test, as described above, was performed on the respective test circuit boards having the protective coatings prepared above. The results are summarized in Table 4.

TABLE 4

| Protective coating composition | Comparative Example 5 | Example 1 | Example 1 |
|---|---|---|---|
| Protective coating thickness (μm) | 20 | 2 | 4 |
| Defective rate (%) after 8 days | 0 | 0 | 0 |
| Defective rate (%) after 9 days | 1 | 1 | 0 |
| Defective rate (%) after 20 days | 18 | 1 | 0 |
| Defective rate (%) after 30 days | 24 | 2 | 1 |
| Defective rate (%) after 40 days | 31 | 8 | 5 |
| Defective rate (%) after 50 days | 35 | 11 | 8 |
| Defective rate (%) after 60 days | 35 | 15 | 8 |

| Protective coating composition | Example 1 | Example 1 | Example 1 |
|---|---|---|---|
| Protective coating thickness (μm) | 12 | 16 | 20 |
| Defective rate (%) after 8 days | 0 | 0 | 0 |
| Defective rate (%) after 9 days | 0 | 0 | 0 |
| Defective rate (%) after 20 days | 0 | 0 | 0 |
| Defective rate (%) after 30 days | 3 | 0 | 3 |
| Defective rate (%) after 40 days | 5 | 1 | 11 |
| Defective rate (%) after 50 days | 8 | 6 | 14 |
| Defective rate (%) after 60 days | 12 | 10 | 15 |

Reliability Test

On the protective coating (thickness 2 μm) formed of the protective coating composition of Example 1, a contact angle measurement test, a saline spray test, and an insulation resistance measurement test were performed. The results are summarized in Table 5.

TABLE 5

| Test item | Test method | Protective coating of Example 1 | Protective coating of Comparative Example 5 (Novec 2704, 3M) |
|---|---|---|---|
| Water Contact angle | Initial | 112.5° | 109.1° |
| | High temperature, high humidity (85° C., 85%, 120 h) | 109.8° | — |
| | Heat shock (−40° C.~85° C., 72 h) | 104.0° | — |
| | UV light (UV-B(313 nm), 72 h) | 105.0° | — |
| Saline spray test | Test circuit board (resistor mounted), 10 days | No change in resistance value | — |
| Insulation resistance test | 500 V | 99.9 GΩm | 11.9 GΩm |

INDUSTRIAL APPLICABILITY

As shown in Table 5, the protective coating formed from the protective coating composition according to the present disclosure exhibits highly effective moisture protection performance as well as highly effective insulation performance, and thus may be highly suitable as a protective coating for a circuit board. In addition, a protective coating formed from the protective coating composition according to the present disclosure can achieve, at an extremely reduced thickness, highly improved protection performance against corrosive gas (hydrogen sulfide in particular) compared to a conventional conformal coating.

The invention claimed is:

1. A protective coating composition for circuit boards, comprising:
    a polyketone;
    a fluorine wax; and
    a solvent,
    wherein the solvent is selected from isopropyl alcohol, methyl isobutyl ketone, normal butyl alcohol, toluene, methyl ethyl ketone, acetone, hexanone, a mixture of ethyl alcohol and normal butyl alcohol, or a combination thereof, and
    wherein an amount of the wax in the protective coating composition is 0.5 wt % or less.

2. The protective coating composition of claim 1, wherein the polyketone comprises a repeat unit represented by Equation 2,

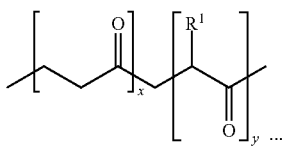

Equation 2 wherein, R1 is hydrogen, a linear or branched alkyl group having 1 to 12 carbon atoms, an aryl group having 6 to 30 carbon atoms, a linear or branched alkyl ether group having 1 to 12 carbon atoms, an aryl ether group having 6 to 30 carbon atoms, a linear or branched alkyl ester group having 1 to 12 carbon atoms, or an aryl ester group having 6 to 30 carbon atoms, and
    wherein x:y is 1:999 to 999:1.

3. The protective coating composition of claim 2, wherein R1 is hydrogen, or a linear or branched alkyl group having 1 to 5 carbon atoms.

4. The protective coating composition of claim 2, wherein R1 is hydrogen or a methyl group.

5. The protective coating composition of claim 1, further comprising an ethylene vinyl alcohol resin.

6. A method of forming a protective coating for circuit boards, the method comprising:
    performing, at least once, a process of applying a protective coating composition on at least a portion of a surface of a circuit board on which an electrical/electronic component is mounted and then drying the protective coating composition,
    wherein the protective coating composition comprises:
        a polyketone, or a combination of a polyketone and an ethylene vinyl alcohol resin;
        a fluorine wax; and
        a solvent, and
    wherein an amount of the wax in the protective coating composition is 0.5 wt % or less.

7. The method of claim 6, wherein a thickness of a protective coating finally formed is about 2 μm to about 5 μm.

8. A laminate comprising:
    a circuit board on which an electrical/electronic component is mounted; and
    a protective coating formed on at least a portion of a surface of the circuit board,
    wherein the protective coating comprises a polyketone, or a combination of a polyketone and an ethylene vinyl alcohol resin and a fluorine wax, and
    wherein an amount of the wax in the protective coating is 9.09 wt % or less.

9. The laminate of claim 8, wherein a thickness of the protective coating is about 2 μm to about 5 μm.

* * * * *